United States Patent
Chakraborty et al.

(10) Patent No.: US 7,284,159 B2
(45) Date of Patent: Oct. 16, 2007

(54) FAULT INJECTION METHOD AND SYSTEM

(75) Inventors: Tapan J. Chakraborty, Princeton Junction, NJ (US); Chen-Huan Chiang, Princeton Junction, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 541 days.

(21) Appl. No.: 10/648,055

(22) Filed: Aug. 26, 2003

(65) Prior Publication Data

US 2005/0050393 A1    Mar. 3, 2005

(51) Int. Cl.
    *G06F 11/00*    (2006.01)
(52) U.S. Cl. .................. 714/41; 714/32; 714/727; 714/737
(58) Field of Classification Search ............. 714/32, 714/41, 33, 725, 727, 737
    See application file for complete search history.

(56) References Cited

U.S. PATENT DOCUMENTS 5,130,988 A * 7/1992 Wilcox et al. ............. 714/727
5,428,624 A * 6/1995 Blair et al. ................ 714/727
5,627,842 A * 5/1997 Brown et al. ............. 714/727
6,202,182 B1 * 3/2001 Abramovici et al. ...... 714/725
6,378,094 B1 * 4/2002 Chakraborty et al. ..... 714/727
6,536,008 B1 * 3/2003 Nadeau-Dostie et al. ... 714/726
2002/0199134 A1 * 12/2002 Davies ........................ 714/25
2004/0268181 A1 * 12/2004 Wang et al. ................ 714/30

OTHER PUBLICATIONS

Chakraborty et al. 'A Novel Fault Injection Method for System Verification Based on FPGA Boundary Scan Architecture'. IEEE Oct. 2002.*
Chau, Savio. 'Fault Injection Scan Design for Enhanced VLSI Design Verification'. IEEE 1993.*
Ke, Wuudiann. 'Backplane Interconnect Test in a Boundary-Scan Environment'. IEEE 1996.*
Nadeau-Dostie, B. et al., "A New Hardware Fault Insertion Scheme for System Diagnostics Verification", Proc. International Test Conference, Oct. 1995, pp. 994-1002.

* cited by examiner

*Primary Examiner*—Yolanda L Wilson

(57) ABSTRACT

A method and system are disclosed for fault injection using Boundary Scan resources compliant with 1149.1, while operating in system mode. The system has two register circuits, one, for storing and updating fault selection data and another, for storing and updating fault injection values.

11 Claims, 2 Drawing Sheets

FAULT INJECTION METHOD AND SYSTEM

FIELD OF THE INVENTION

This present invention relates to automatic testing for faults in integrated circuits, and more particularly, to a fault injection method and system.

BACKGROUND OF THE INVENTION

Equipment hardware that must perform system operations without interruption is continuously monitored by system diagnostic software. The diagnostic software monitors the equipment hardware for detection of fault conditions, and switches the system operations to run on redundant circuitry that would avoid the fault condition. The system diagnostic software itself needs to be tested. Fault injection is a procedure involving the injection of fault conditions directly on equipment hardware to test the systems diagnostic software for response to the injected fault conditions. However, the equipment hardware would lack input and output connection points for injection of fault conditions, because of crowded micro-processors, FPGAs and ASICs on typical circuit boards, and due to imbedding of interconnection points in interior layers of the typical circuit boards.

Boundary scan (B-S) is a structured test technique that was developed to test integrated circuit (IC) interconnects on printed wire boards (PWBs) when physical access is impossible, difficult, or impractical. Implementation of the boundary scan test technique requires that a shift register and latch be placed at the functional inputs and outputs (I/Os) of an IC. Each I/O pin can be driven to a known state or the current logic level can be captured and scanned out via a four-wire serial bus.

The test bus and protocol as well as the behavior of the boundary cells are defined in IEEE Std. 1149.1. This standard defines a standard test logic architecture for implementing boundary scan functions which can be included in an integrated circuit for the purpose of testing the interconnects to the integrated circuit, the integrated circuit itself, or other integrated circuits. The test architecture is defined to include a test access port (TAP) having connections for a test clock pin (TCK), a test mode select pin (TMS), a test data input pin (TDI) and a test data output pin (TDO). The test architecture also includes a TAP controller (boundary-scan state machine). Thus, as IC pin counts increase, pin spacing decreases, and direct pin accessibility becomes increasingly difficult, boundary scan (B-S) is playing an increasing role in design verification, manufacturing, and the testing of new products.

At present boundary scan allows all pins of a B-S chip to be controlled uniformly by either system or B-S logic. The requirement that all pins are controlled by the same logic (that is, for the same chip, some pins cannot be controlled by system logic while others are controlled by B-S registers), however, limits B-S usage for many applications, for example, those applications requiring fault injection.

Fault injection, also known as fault insertion, is a widely used method to develop high quality test for complex systems. Not only has it been used to verify fault tolerant capabilities and system-level built-in self test (BIST) hardware designs, but also used to develop and verify diagnostic software for highly reliable systems. It is very difficult and sometimes impossible to perform these system verification tasks via simulations at the board or system level. The most common fault injection method is the physical pin-level fault injection, where a stuck-at or open fault is injected to a pin of a chip via a switch or jumper. Usually only a handful pins are selected to be modified for fault injection due to a number of problems, such as restriction of physically accessible pins of highly dense package devices on a board, possible damage to the devices, lengthy labor intensive process to set up the physical fault injection, and so on. Hence, not only the resulting fault coverage is low but also the test process is very expensive.

Previously, a number of fault injection methods and systems have been proposed for ASICs. In these methods and systems, the standard B-S cells and test access port (TAP) controllers are modified, and the instruction set is enhanced to provide a mechanism for 'virtual' fault injection compared to the traditional physical methods. Such an application is beyond the well-known B-S application for testing interconnects in manufacturing testing. And the application can not be implemented in previously installed operating systems, because they have previously existing IEEE 1149.1 boundary scan standard compliant architecture, which do not have modified BS cells, and which can not be tested with modified TAP controllers.

A number of fault injection methods and systems have been proposed. The first proposed method uses the SAMPLE/PRELOAD instruction to preload fault values, followed by another instruction to expose the fault values to the corresponding output pins. However, neither the implementation of the fault injection instruction nor the enhancement of the B-S cell to support fault injection have been given.

The second proposed method is to use the standard B-S instruction (HIGHZ or CLAMP) to alter the output values for all the output pins of a B-S device. Although no modification of the TAP and B-S register is required at all to use this method, it is not sufficient in most of system verification.

Another method and system has been proposed by Savio Chau in "Fault Injection Boundary Scan Design for Verification of Fault Tolerant Systems", Proc. of International Test Conference, October, 1994, pp. 677-681. Chau proposes to modify B-S circuitry to inject faults at individual pins, in which the value of the B-S register is used to determine if a fault is injected or not.

Chau describes three B-S designs, each of which requires modification of IEEE 1149.1 Boundary Scan standard compliant architecture to support fault injection. However, in the first design, the faulty value to be injected must be identical on all selected pins. Furthermore, the B-S data register is constrained from being shifted to update status during fault injection. The second design modifies the IEEE 1149.1 Boundary Scan standard compliant architecture with a tri-state buffer for stuck-open fault injection. In the third design, the pin selection data, determining which pins will be injected with faults, is loaded into the update flip-flop (FF) of a modified B-S register. Once the fault injection enable FF is set in the instruction register of the modified B-S architecture, the fault injection values are injected on the selected pins. However, there are two main drawbacks of this design: (i) the fault injection selection data, which were previously shifted into the update FF of the B-S register, are corrupted when entering the update state of the TAP controller while the fault injection values are shifted in; (ii) the logic values of the fault injection pins are rippling when the fault injection values are shifting into the capture FF of the B-S register.

In another reference, Nadeau-Dostie, B. et al., "A New Hardware Fault Insertion Scheme for System Diagnostics Verification", Proc. of International Test Conference, October, 1995, pp. 994-1002, an alternate fault injection method is proposed for system diagnostics verification. It achieves several improvements over the designs in Chau, but the area overhead can be as high as 50 to 100% depending on the pad type. There are also some compliance issues with the IEEE 1149.1 Boundary Scan standard.

The system described by Nadeau-Dostie et al. requires modification of the B-S register so that the update state of TAP controller is suppressed to avoid the corruption of the data that was previously shifted in. To prevent the rippling effect on the output of a fault injection pin, two separate B-S cells are used, one for storing the fault injection selection data and the other for the fault injection value, instead of two FFs within a B-S cell, as proposed by Chau.

The methods and systems proposed by both Chau and Nadeau-Dostie et al. can not be implemented unless IEEE 1149.1 Boundary Scan standard compliant architecture is modified as proposed by Chau and Nadeau-Dostie et al.

The previously proposed systems and methods do not fulfill a present need for a fault injection system and method that uses existing IEEE 1149.1 Boundary Scan standard compliant resources without modification, and which can be implemented by existing installed operating systems. Further, the previously proposed systems and methods do not fulfill a present need for a fault injection system and method that is operative in system mode.

SUMMARY OF THE INVENTION

The present invention includes a system for fault injection of a circuit device, which uses existing IEEE 1149.1 Boundary Scan standard compliant resources without modification, and which can be implemented by existing installed operating systems. The system has, a fault selection circuit adapted with fault selection data identifying selected circuit outputs of the circuit device, a fault value circuit adapted with fault values for injection on corresponding selected circuit outputs, and the fault selection circuit controlling the selected circuit outputs in place of system logic control during the injection of respective fault values.

According to an embodiment of the invention, a fault selection circuit is in the form of a user defined scan register in the circuit device.

According to another embodiment of the invention, a fault value circuit is in the form of a user defined scan register in the circuit device.

According to another embodiment of the invention, the system selects an internal register for fault injection, and the internal register is in the system logic of the circuit device.

Another embodiment of the invention is a method for injection of fault values at selected pins of a programmable circuit device. The method steps include, storing and updating fault injection selection data in a first register; scanning and storing fault injection values in a second register; and updating the fault injection selection data and the fault injection values at selected pins of the programmable circuit device, while the selected pins are controlled by the first and second register instead of by system logic of the circuit device.

Embodiments of the invention will now be described by way of example with reference to the accompanying drawings.

DETAILED DESCRIPTION

Figure 1:
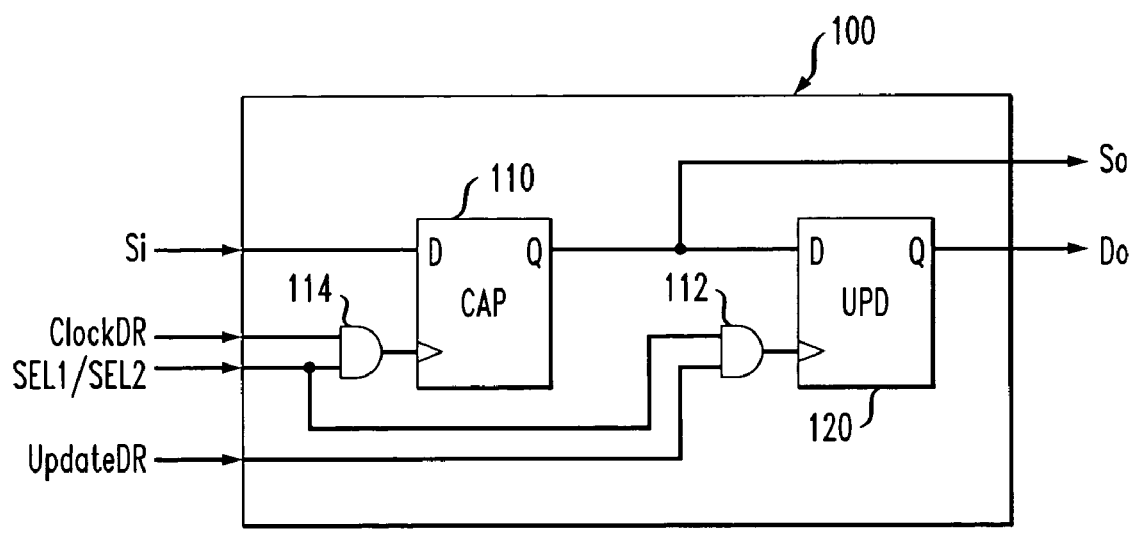
FIG. 1 is a circuit diagram of a user defined scan register (USR) or cell according to the present invention.

The present invention comprises a novel fault injection (e.g., fault insertion) system and method to facilitate the development of high quality system testing. The method and system relies on existing boundary scan resources, without requiring modification, to inject a fault value at a selected output, which includes, but is not limited to, a pin and a fault injection functional internal register of a Field Programmable Gate Array (FPGA). When a pin is referred to herein, the pin means an output, input or bidirectional input-output where fault injection is desired. Further, when an FPGA is referred to herein, the FPGA means a programmable semiconductor device, including, but not limited to, a programmable gate array, a programmable read only memory, and an integrated circuit device having programmable or burnable fuses.

The invention injects fault values while the FPGA is in system mode, rather than in boundary scan mode. Thus, the invention uses existing and unmodified boundary scan resources, which are compliant with the IEEE 1149.1 Boundary Scan standard, and which include; an existing test access port (TAP) controller and existing B-S signals and instructions.

In XilinX™ FPGAs (as well as ORCA™ FPGAs), there are two available user-defined instructions, USER1 and USER2. A logic block named B-SCAN in these FPGAs is similar to the BNDSCAN in ORCA™ FPGAs. The BSCAN logic block accesses the BS TAP controller for signals used in the design of the user defined instructions. The user defined instructions are used in the design of a BS cell (100) to inject a fault value at any pin of the FPGA while the FPGA is on a circuit board. This enables fault injection testing of the FPGA while operating on the circuit board. The resulting BS cell (100) is compliant with the industry standard, IEEE 1149.1, since the user defined instructions are built in to an FPGA. Such user defined instructions are implemented without requiring new instruction signals for an existing BS TAP controller. Thus, the BS cell (100) is adapted to use an existing BS TAP controller without modification.

In a Xilinx™ FPGA design, once the user-defined instructions are used (i.e., once the B-SCAN logic block is used), there are five (JTAG) pins compliant with the IEEE 1149.1 Boundary Scan standard. These defined (JTAG) pins are dedicated for B-S only and not available for general I/O any more.

If an FPGA has only one user-defined instruction available, it is possible to merge two USRs into one, where an adjacent pair of USR cells are used to store fault injection selection data and value respectively. However, the update state of the second USR cell must be suppressed to avoid data corruption.

Due to the programmability of an FPGA, it costs less area overhead than the existing B-S based fault injection methods for ASICs. It is also possible to reconfigure where and what type of faults to be injected via B-S while the system is functioning. Although this method incurs additional delay of a multiplexer on the pin where a fault is injected, the area overhead and performance impact are significantly less than existing fault injection methods.

According to design experiences of the existing fault injection methods and due to the frequent use of FPGAs in present day complex digital systems, five design-for-testability (DFT) objectives are set for an FPGA fault injection method: (1) use the existing FPGA B-S architecture, (2) comply with the IEEE 1149.1 Standard, (3) avoid the rippling effect on the output of a fault injection pin, (4) avoid data corruption problem in the update state of the TAP controller, and (5) core implementation of the fault injection (a truth table describing fault injection states in terms of fault injection selection data and fault injection value). In the following, the fault injection method according to the invention fulfills these five DFT objectives.

FIG. 1 shows a user defined scan register (USR1) or (USR2) or cell (100). The USR1 or USR2 cell (100) has a capture flip flop (FF) (110) and an update FF (120). The capture FF (110) acquires input data, and is prevented from changing state to shift the data to an output DO of the register (100) until the capture FF (110) has been shifted to an update state. This feature differs from using a single FF to both acquire data and shift the data to the output, which would cause data rippling.

With further reference to FIG. 1, the capture flip flop (110) has an input Si and output So. The output Do of the cell (100) is updated by the update flip flop (120) switched to an update state during the update state of the TAP controller. An update signal, Update DR, is supplied by the TAP controller to an AND gate (112) at the input side of the update flip flop (120). The capture flip flop (110) and the update flip flop (120) are activated by an enable signal SEL1/SEL2 from a BSCAN logic block when a corresponding user instruction USER1 or, alternatively, USeR 2 is in effect. The BSCAN logic block is a known circuit in a commercially available FPGA.

The USR1 or USR2 cell (100) operates with boundary scan resources similarly as would a conventional B-S cell according to the IEEE Std. 1149.1, with some key differences. As with the conventional B-S cell, the USR cell (100) includes a scan input $S_i$, a clock input ClockDR, an update input UpdateDR, a scan output $S_o$, and a data output $D_o$. Differing from a conventional B-S cell, the USR cell (100) includes a selection input SEL1/SEL2.

The selection input SEL1/SEL2 of the USR cell (100) is coupled to a first input of a first AND gate (114) of the USR cell. The other input of the first AND gate (114) is coupled to the clock signal ClockDR such that the loading of the signal on the selection input SEL1/SEL2 is controlled by the clock signal. In the exemplary embodiment of the present invention, the selection input SEL1/SEL2 of the USR1 or USR2 cell (100) comprises one of two logic levels (e.g., a logic "1" or a logic "0"). When the selection input SEL1/SEL2 is a logic "1", data is shifted to the capture flip-flop (110) at scan input $S_i$. When the selection input SEL1/SEL2 is a logic "0", the scan input $S_i$ is disabled (i.e., no instruction may be loaded). The capture flip flop (110) changes state to shift the data to the update FF. The selection input SEL1/SEL2 is also coupled to a first input of the second AND gate (112) of the USR cell (100). The other input of the second AND gate (112) is coupled to the update signal Update DR such that the loading of the signal on the selection input SEL1/SEL2 is controlled by the update signal from the TAP controller.

The output of the capture flip-flop (110) is coupled to both the input of the update flip-flop (120) and the scan output $S_o$ of the USR1 or USR2 cell (100). The output of the update flip-flop (120) is coupled to the data output D0 of the USR1 or USR2 cell (100).

According to the invention, a first BS cell (100) is used to scan and store fault selection data, i.e., the identities of input and output pins. A second BS cell (100), a duplicate of the first BS cell (100), is used to scan and store fault injection values to be assigned to the input and output pins. Thus, two BS cells (100) of FIG. 1 are provided by the invention for each pin injected with a fault. For example, an FPGA with 600 pins, requires fault injection testing of only 50 pins. The user defined instructions for programming a commercially available FPGA, determines which pins are input and which pins are output.

Each BS cell (100) has an AND gate (114) receiving the SEL1/SEL2 enable signal from the BSCAN logic block. A clock signal, Clock DR, is received at the AND gate (114) from one of the user defined instructions USR1 or USR2. The first BS cell (100) receives an independent first clock signal from the first user defined instruction, USR1. The second BS cell (100) receives an independent second clock signal from the second user defined instruction, USR2. Since two separate user defined instructions, USR1 and USR2, are controlled by independent clock signals, the two BS cells (100) scan and store the fault selection values and the fault injection values, respectively, without rippling of pin values and fault injection values data corruption, when the respective update flip flops (120) are switched to the update status to inject the fault values on the selected pins.

Figure 2:
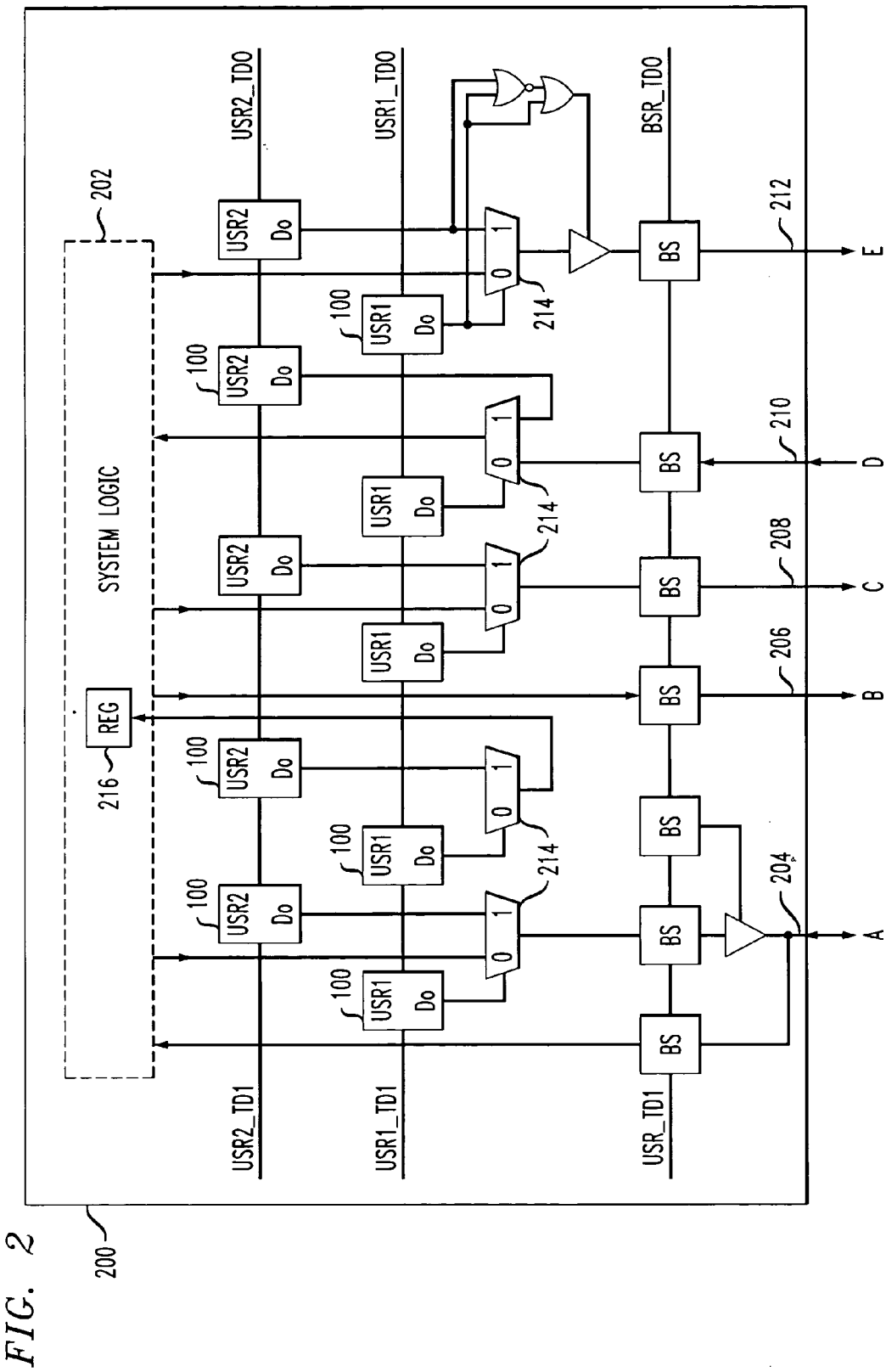
FIG. 2 is a circuit diagram of a system for fault injection in system mode according to the present invention.

FIG. 2 discloses a system 200 for fault injection. For each pin considered for fault injection, a cell USR1 (100) captures and updates fault selection data (selected pins data). A cell USR2 (100) captures and updates fault injection values for injection on the selected pins.

FIG. 2 discloses an FPGA with system logic (202) controlling the signal transmitting pins, of which pins A, B, C and D are examples. Pin D is an example of input pins. Pins B, C and E are examples of output pins. Pin A is an example of bidirectional pins. With the FPGA operating in system mode, the system logic (202) controls the pins. Signals to and from system logic (202) are transmitted by the exemplary pins A-D. System logic (202) controls pins A-D over respective signal communications lines (204), (206), (208), (210) and (212).

In the circuit disclosed by FIG. 2, the ell USR1 (100) captures and scans data selecting the pins or other output locations to receive fault injection values. When a pin or other output location is to receive a fault injection value, the pin is under control of the USER1 user instruction while a fault injection value is injected. When a pin is not selected to receive a fault injection value, the pin remains under control by the system logic (202).

The invention performs fault injection using Boundary Scan resources compliant with the IEEE 1149.1 Boundary Scan standard, while operating in system mode, rather than boundary scan mode. No modification is required for the Boundary Scan configurations of existing installed systems. Thus, existing installed systems can implement the invention while operating in system mode, rather than boundary scan mode.

The invention performs injection of a selected fault value on a selected pin while the other pins are controlled by system logic (202). Thus, system logic (202) does not have to be interrupted while the invention performs fault value injection on a selected pin. Further, the register or cell construction according to FIG. 1, rapidly changes the pin selections, and separately shifts injection values at rapid rates, which allows the system logic (202) to control all but a few pins that are under selection for fault injection values.

The time duration is limited for interruption of the selected pins from control of the system logic (202), while being injected with a selected fault value.

FIG. 2 discloses that the USR1 (100) register, having the register construction of FIG. 1, comprises the pin selection logic, USR-TD1, by which the pins are selected for fault value injection, while the selected pins are controlled by the output of a corresponding multiplexer, mux 10. FIG. 2 further discloses that the USR2 (100) register, having the register construction of FIG. 1, comprises the fault value logic by which selected fault values are injected while the selected pins are removed from control of the system logic (202), and controlled by the output of a multiplexer, mux, (214).

When the pin selection logic is "1" (One) for a corresponding pin, the pin is selected for injection of a corresponding fault value, and the selected pin value and corresponding fault value are supplied to the mux (214) The output of the mux (214) directly controls the selected pin, without having to activate BSR-TDI boundary scan mode which would interrupt system mode operations of the system logic (202).

When the pin selection logic is "0" (Zero) for a corresponding pin, the pin has not been selected for injection of a corresponding fault value. The mux (214) has no output to control the corresponding pin. The corresponding pin remains under control of the system logic (202) of the FPGA. Thus, selected fault values are injected on selected pins without having to suspend or interrupt system logic control of the other pins that are not being injected with selected fault values.

According to another embodiment of the invention, the output of each mux (214) is supplied to a corresponding internal, fault injection site, a functional register REG (216) of the system logic 7. Thus, the FPGA is tested for internal faults, which would not limit the invention to testing only for FPGA output faults.

The output pins of each FPGA or ASIC on a typical circuit board are serially connected in series chain connection, or daisy chain connection, with corresponding input pins of a subsequent FPGA or ASIC in the series chain connection. When the boundary scan register of an FPGA is interconnected by daisy chain connections with boundary scan registers of other FPGAs and ASICs on a circuit board, the invention injects fault values on selected outputs located in the daisy chain connections. The shift registers USR1-TDI and USR2-TDI, that have the construction of FIG. 1, scans the pin values and fault values corresponding to each of the pins in the series chain connection. Thus, the invention can be used to test the multiple FPGAs and ASICs on a typical circuit board in real time, while the circuit board is operating in a communications system.

Table 1 shows the states of USR 1 and USR 2 with corresponding pins in various states of fault injection iterations. Table 1, shows the states of the pins corresponding to injection of stuck-at fault injection values. Pin C of FIG. 2 embodies the fault injection values of Table 1.

TABLE 1

Fault injection (FI) function - without stuck-open effect.

| FI Selection Data | FI Value | Output State | FI Effect |
|---|---|---|---|
| 0 | 0 | Driven by system logic | no fault |
| 0 | 1 | Driven by system logic | no fault |

TABLE 1-continued

Fault injection (FI) function - without stuck-open effect.

| FI Selection Data | FI Value | Output State | FI Effect |
|---|---|---|---|
| 1 | 0 | Driven by a constant 0 | stuck-at-0 |
| 1 | 1 | Driven by a constant 1 | stuck-at-1 |

Table 2 shows the states of the pins corresponding to iterations of stuck-open as well as stuck-at fault injection values. The circuit of FIG. 2 includes a tri-state buffer (14) to implement the states described in Table 2.

TABLE 2

Fault injection function - with a stuck-open effect.

| FI Selection Data | FI Value | Output State | FI Effect |
|---|---|---|---|
| 0 | 0 | Driven by system logic | no fault |
| 0 | 1 | High-Z | stuck-open |
| 1 | 0 | Driven by a constant 0 | stuck-at-0 |
| 1 | 1 | Driven by a constant 1 | stuck-at-1 |

The system mode withholds boundary scan mode from the boundary scan register 12 at the output side of pin A, while the output of the mux (214) directly controls pin C in the system mode. The pin A is a bidirectional signal pin. Thus an input signal is supplied from the pin A to the system logic (202) that controls the input side of the pin A, while withholding boundary scan mode from the boundary scan register (100) at the input side of pin A.

Only output signal pins or a bidirectional signal pins in the output state are considered for fault injection. Output pin B, for which no fault injection values are intended is always under control of the system logic (202). Pin A is a bidirectional pin, which can be injected with either an input fault condition or an output fault condition. A selection of fault values for different fault conditions can be injected for the input direction and/or the output direction.

When USR 1 (100) is executed, the control signal SEL1 becomes active. Further, USR 1 (100) replaces the BS register in the circuit that receives TDI and TDO signals. FI pin selection data is shifted into USR 1 (100).

When USR 2 (100) is executed, the control signal SEL 2 becomes active. Further, USR 2 (100) replaces the BS register in the circuit that receives TDI and TDO signals. FI fault value selection data is shifted into USR 2 (100). Thus, FI pin selection data and FI fault values are stored in two independent USR registers, which avoids rippling of selection data and corruption of fault values.

The lengths of USR1 and USR 2 circuits are equal to the number of pins where fault injections are needed. Lengthy USR1 and USR 2 circuits consume excessive area and slow down system performance. The lengths of USR1 (100) and USR2 (100) would be equal to the number and locations of pins where fault injection are needed. However, according to the invention, since not every pin is injected with a fault injection value at the same time, the two BS cells (100) are needed only at each output pin where fault injection is ongoing. Thus, the lengths of the USR 1 and USR circuitry is relatively short. Further, the FPGA is programmable to reprogram the circuit of FIG. 2 for implementation only at the desired iteration of pins for ongoing fault injection, which reduces the area overhead and performance impact.

Once the faults are injected, as long as the FPGAs are in functional mode (i.e., SAMPLE mode), the injected fault effects are always in effect. Note that, the method according to the invention incurs an additional delay of one multiplexer on the pin where a fault is injected. For the output pin where fault injection is not desired, such as Pin B in FIG. 2, no USR logic is allocated at all.

The design of the fault injection logic incurs additional delay of a multiplexer on the fault injection pins. However, our method is designed for FPGAs, and the programmability of an FPGA enables us to add fault injection logic only to where fault injection function is desired. Hence, area overhead and performance impact can be modified to the exact need.

Because the fault injection logic is independent of system logic in the method according to the invention, the fault injection pattern can be changed while the system is functioning. This capability enables a new fault injection pattern, including fault injection value and selection data, to be shifted asynchronously during system mode function of the FPGA to improve the quality of system diagnosis and verification.

According to the invention, boundary scan cells operate with user defined instructions built into the FPGAs of the equipment to inject fault conditions directly on the equipment hardware, while the equipment runs in real time. This serves to change the functionality of the equipment hardware. The system diagnostic software is supposed to detect the hardware functionality change. Thus, the invention tests the system diagnostic software for its responsiveness to the hardware functionality change, without having to switch the operating equipment from system mode operation to boundary scan mode operation. While the operating equipment runs in real time, the system diagnostic software can be tested according to the invention.

The invention enables each of the user-defined instructions, USER1 and USER2 to inject a fault at any pin of the FPGA while the FPGA is mounted on a circuit board, such as a PCI card. Another application for the invention is vector verification. According to the invention, injecting stuck-on fault injection values (or, alternatively, injecting stuck-at fault injection values) on selected pins connected in a fault injection circuit between system logic of the programmable circuit device and the selected pins, while the programmable circuit device is mounted on a circuit board, is operative to test for vector verification of circuitry of the circuit board.

An application of the invention for vector routing verification involves, injecting stuck-on fault injection values on selected first pins connected in a fault injection circuit between system logic of the programmable circuit device and the first pins, while the programmable circuit device is mounted on a circuit board, to test for vector routing verification of the circuit board; and injecting stuck-at fault injection values on selected second pins connected in a fault injection circuit between system logic of the programmable circuit device and the second pins, while the programmable circuit device is mounted on a circuit board, to test for vector routing verification of the circuit board.

Another application of the invention is testing a new algorithm, which involves, injecting stuck-on fault injection values on selected first pins connected in a fault injection circuit between system logic of the programmable circuit device and the first pins, while the programmable circuit device is mounted on a circuit board being tested by verification test software, to test for verification of a new algorithm of the software; and injecting stuck-at fault injection values on selected second pins connected in a fault injection circuit between system logic of the programmable circuit device and the second pins, while the programmable circuit device is mounted on a circuit board being tested by verification test software, to test for verification of a new algorithm of the software.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A method for injection of fault values at selected fault injection locations of a programmable circuit device, comprising:
   storing and updating fault injection selection data in a first register in response to a first clock signal;
   scanning and storing fault injection values in a second register in response to a second clock signal independent of the first clock signal, wherein the fault injection values comprise either stuck-at fault injection values or stuck-on fault injection values for corresponding fault injection locations of the programmable circuit device; and
   updating the fault injection selection data and the fault injection values at the selected fault injection locations of the programmable circuit device, while the selected fault injection locations are controlled by the fault injection selection data in the first register and by the fault injection values in the second register instead of by system logic of the programmable circuit device.

2. The method of claim 1, and further comprising:
   injecting stuck-on fault injection values on the selected fault injection locations, wherein the selected fault locations comprise selected pins.

3. The method of claim 1, and further comprising:
   injecting stuck-at fault injection values on the selected fault injection locations, wherein the selected fault locations comprise selected pins.

4. The method of claim 1, and further comprising:
   injecting stuck-on fault injection values on the selected fault injection locations, wherein the selected fault locations comprise selected pins; and
   injecting stuck-at fault injection values on the selected fault injection locations, wherein the selected fault locations comprise selected pins.

5. The method of claim 1, and further comprising:
   injecting stuck-on fault injection values on the selected fault injection locations, wherein the selected fault locations comprise selected pins, while the programmable circuit device is mounted on a circuit board, to test for vector verification of circuitry of the circuit board.

6. The method of claim 1, and further comprising:
   injecting stuck-at fault injection values on the selected fault injection locations, wherein the selected fault locations comprise selected pins, while the programmable circuit device is mounted on a circuit board, to test for vector verification of circuitry of the circuit board.

7. The method of claim 1, and further comprising: injecting one or more of the fault injection values at an internal register in the system logic of the programmable circuit device.

8. A method for injection of fault values at selected fault injection locations of a programmable circuit device, comprising:
   storing and updating fault injection selection data in a first register;

scanning and storing fault injection values in a second register; and updating the fault injection selection data and the fault injection values at the selected fault injection locations of the programmable circuit device, while the selected fault injection locations are controlled by the fault injection selection data in the first register and by the fault injection values in the second register instead of by system logic of the programmable circuit device;

injecting stuck-on fault injection values on selected first pins of the fault injection locations connected in a fault injection circuit between system logic of the programmable circuit device and the first pins, while the programmable circuit device is mounted on a circuit board, to test for vector routing verification of the circuit board; and injecting stuck-at fault injection values on selected second pins of the fault injection locations connected in a fault injection circuit between system logic of the programmable circuit device and the second pins, while the programmable circuit device is mounted on a circuit board, to test for vector routing verification of the circuit board.

9. The method of claim 8, and further comprising:

storing and updating fault injection selection data in the first register in response to a first clock signal;

scanning and storing the fault injection values in the second register in response to a second clock signal independent of the first clock signal, wherein the fault injection values comprise either stuck-at fault injection values or stuck-on fault injection values for corresponding said selected fault injection locations of the programmable circuit device.

10. A method for injection of fault values at selected fault injection locations of a programmable circuit device, comprising:

storing and updating fault injection selection data in a first register;

scanning and storing fault injection values in a second register; and updating the fault injection selection data and the fault injection values at the selected fault injection locations of the programmable circuit device, while the selected fault injection locations are controlled by the fault injection selection data in the first register and by the fault injection values in the second register instead of by system logic of the programmable circuit device;

injecting stuck-on fault injection values on selected first pins of the fault injection locations connected in a fault injection circuit between system logic of the programmable circuit device and the first pins, while the programmable circuit device is mounted on a circuit board being tested by verification test software, to test for verification of a new algorithm of the software; and injecting stuck-at fault injection values on selected second pins of the fault injection locations connected in a fault injection circuit between system logic of the programmable circuit device and the second pins, while the programmable circuit device is mounted on a circuit board being tested by verification test software, to test for verification of a new algorithm of the software.

11. The method of claim 10, and further comprising:

storing and updating the fault injection selection data in the first register in response to a first clock signal;

scanning and storing fault injection values in a the second register in response to a second clock signal independent of the first clock signal, wherein the fault injection values comprise either stuck-at fault injection values or stuck-on fault injection values for corresponding said selected fault injection locations of the programmable circuit device.

\* \* \* \* \*